United States Patent
Li et al.

(10) Patent No.: US 9,176,200 B2
(45) Date of Patent: Nov. 3, 2015

(54) POWER SUPPLY TEST DEVICE

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Ji-Chao Li, Shenzhen (CN); Yun Bai, Shenzhen (CN); Dan-Dan Liu, Shenzhen (CN); Song-Lin Tong, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 331 days.

(21) Appl. No.: 13/914,585

(22) Filed: Jun. 10, 2013

(65) Prior Publication Data
US 2013/0342237 A1     Dec. 26, 2013

(30) Foreign Application Priority Data
Jun. 21, 2012   (CN) .......................... 2012 1 02066659

(51) Int. Cl.
*G01R 31/40*     (2014.01)

(52) U.S. Cl.
CPC ..................................... *G01R 31/40* (2013.01)

(58) Field of Classification Search
CPC .......... G01R 31/3662; G01R 31/3668; G01R 31/40; G01R 31/007; G01R 31/025; G01R 27/025; G01R 31/12; G01R 31/311; G01R 31/3631
See application file for complete search history.

(56) References Cited

U.S. PATENT DOCUMENTS 5,001,620 A * 3/1991 Smith .............................. 363/89
5,572,136 A * 11/1996 Champlin ..................... 324/426
5,821,756 A * 10/1998 McShane et al. ............. 324/430

* cited by examiner

*Primary Examiner* — Tung X Nguyen
(74) *Attorney, Agent, or Firm* — Novak Druce Connolly Bove + Quigg LLP

(57) ABSTRACT

A power supply test device includes a function generator, a loading circuit, a current detection circuit, and a controller. The function generator outputs a square-wave signal to the loading circuit. The loading circuit is electronically connected to a power supply, the loading circuit regulates an output current of the power supply according to the square-wave signal. The current detection circuit cooperates with the controller in detecting a slope of the output current. The controller compares the detected slope with a preset value, and regulates the square-wave signal according to the comparison to regulate the slope of the output current.

13 Claims, 3 Drawing Sheets

POWER SUPPLY TEST DEVICE

BACKGROUND

1. Technical Field

The exemplary disclosure generally relates to test devices, and particularly to a power supply test device.

2. Description of Related Art

A load of a voltage regulator module (VRM) of a computer is a dynamic load, which means the load of the VRM continuously changes and an output of the VRM dynamically changes with the change of the load. For example, when the computer executes a large software game, the load of the VRM increases, and the output current of the VRM increases accordingly.

When testing a dynamic response of the VRM, an electronic load is connected to an output terminal of the VRM. The electronic load regulates the output current of the VRM to simulate a dynamic load. FIG. 3 shows a simplified wave diagram of an output current of a VRM when the VRM executes a dynamic response test. In FIG. 3, a rise time t1 is the time taken by the output current of the VRM to change from 0 to a specified value I1. A slope of the output current is a ratio of the value I1 and the rise time t1. In use, different VRMs may have different requirements for slope of the output current to drive different specified loads. However, a present electronic load can drive the VRM to output an output current with only one slope, and cannot arrive at the requirement of variable slopes.

Therefore, there is room for improvement within the art.

BRIEF DESCRIPTION OF THE DRAWINGS

Many aspects of the embodiments can be better understood with reference to the drawings. The components in the drawings are not necessarily drawn to scale, the emphasis instead being placed upon clearly illustrating the principles of the disclosure.

DETAILED DESCRIPTION

Figure 1:
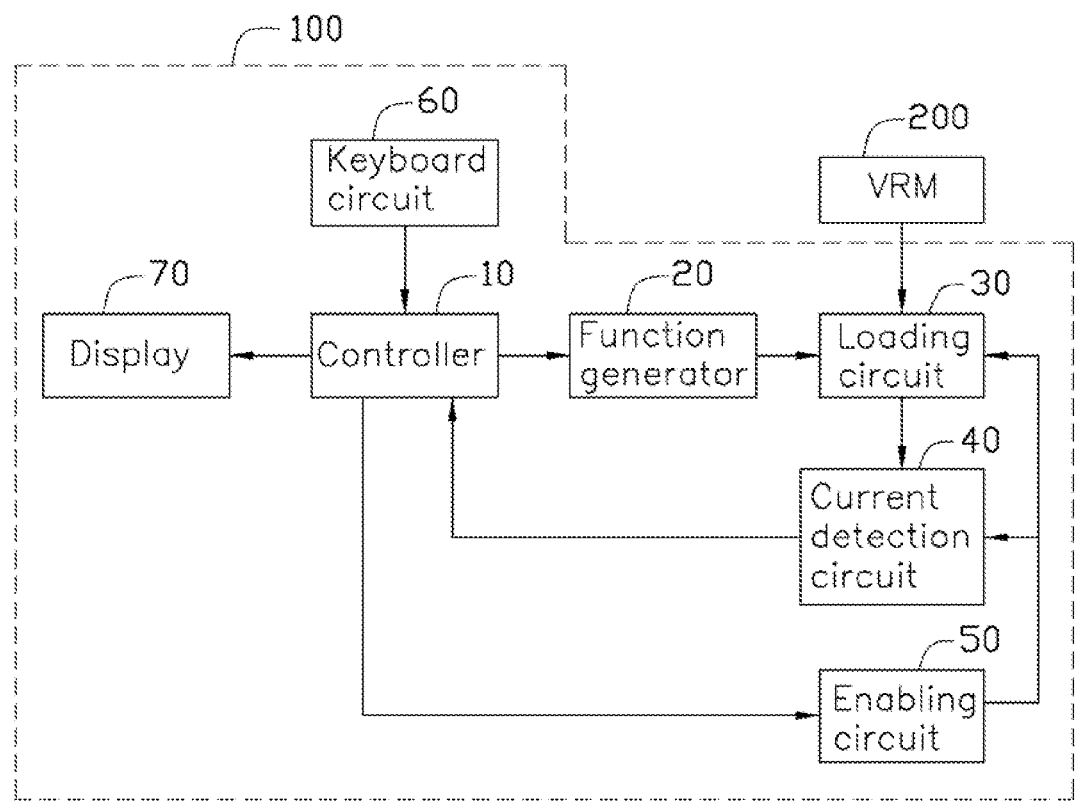
FIG. 1 shows a block diagram view of an exemplary embodiment of a power supply test device.

FIG. 1 shows a block diagram view of an exemplary embodiment of a power supply test device 100. The power supply test device 100 executes a dynamic load test for a power supply. In the exemplary embodiment, the power supply is a voltage regulator module (VRM) 200. The power supply test device 100 includes a controller 10, a function generator 20, a loading circuit 30, a current detection circuit 40, an enabling circuit 50, a keyboard circuit 60, and a display 70. The function generator 20 outputs a square-wave signal; the loading circuit 30 regulates an output current Io of the VRM 200 actively according to the square-wave signal; the current detection circuit 40 cooperates with the controller 10 in detecting the output current Io and a slope of the output current Io. The slop is a ratio of a rise time and a steady value of the output current Io of the VRM 200, and the rise time is the time taken by the output current Io of the VRM 200 to change from about zero to steady value. The controller compares the slope of the output current Io with a preset value, and controls the function generator 20 to regulate a waveform of the square-wave signal, until the slope of the output current Io of the VRM 200 is about equal to the preset value.

Figure 2:
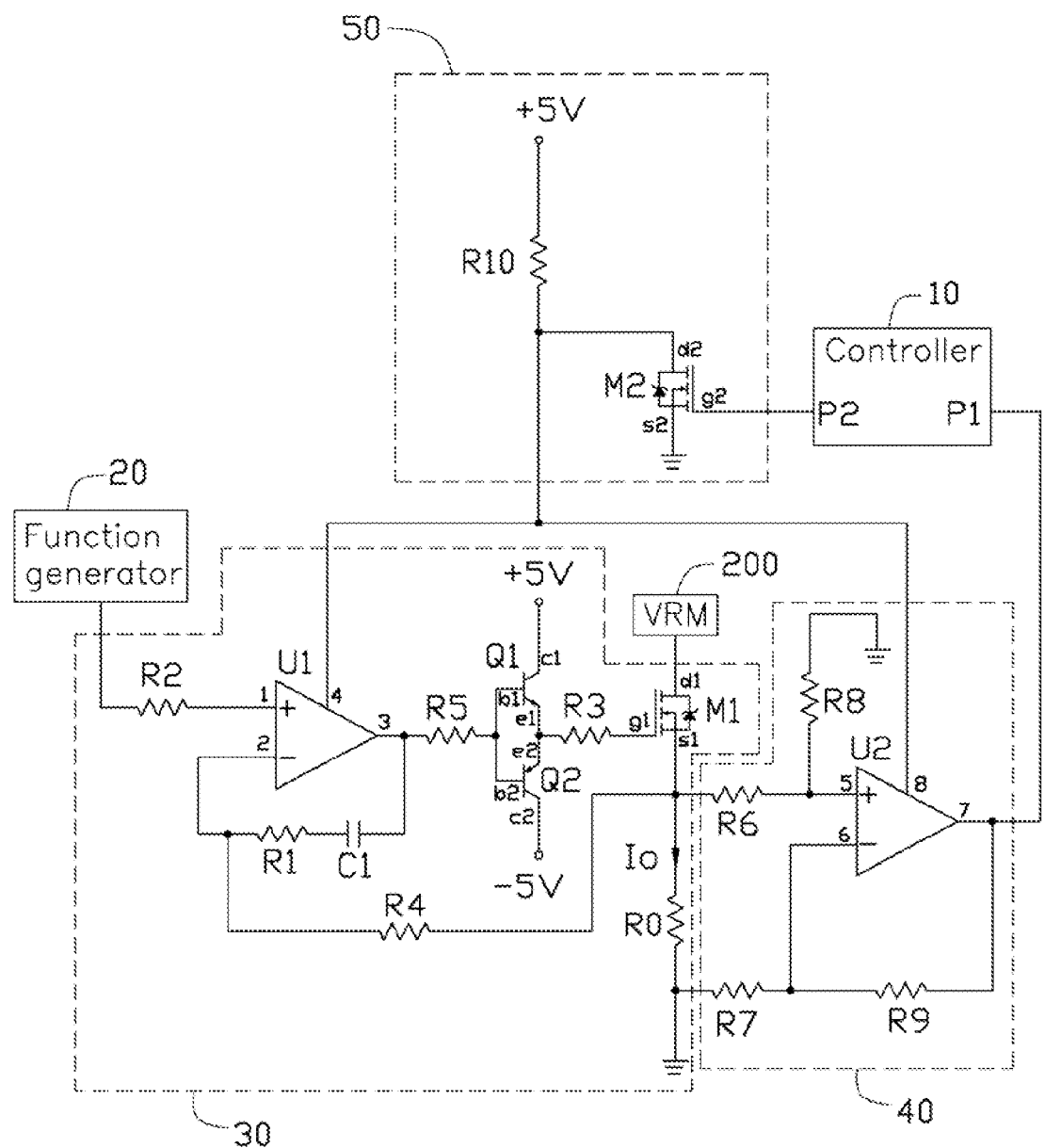
FIG. 2 shows a circuit diagram of the power supply test device shown in FIG. 1.
Figure 3:
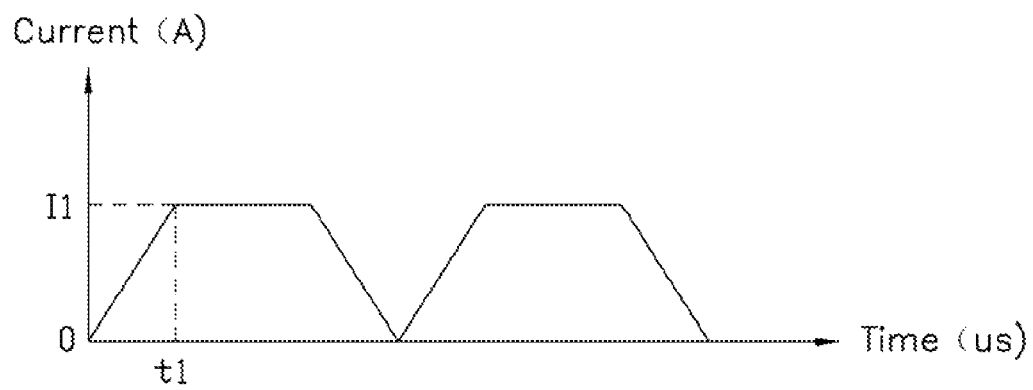
FIG. 3 shows a simplified wave diagram of an output current of a VRM when the VRM executes a dynamic response test.

FIG. 2 shows a circuit diagram of the power supply test device 100 shown in FIG. 1. The controller 10 includes a current detection pin P1 electronically connected to the current detection circuit 40, and a control pin P2 electronically connected to the enabling circuit 50.

The loading circuit 30 includes a voltage follower U1, a first metal-oxide-semiconductor field-effect transistor (MOSFET) M1, a loading resistor R0, a filtering resistor R1, four current limiting resistors R2-R5, and a filtering capacitor C1. The voltage follower U1 includes a non-inverting input terminal 1, an inverting input terminal 2, an output terminal 3, and a control terminal 4. The non-inverting input terminal 1 is electronically connected to the function generator 20 via the current limiting resistor R2, to receive the square-wave signal. The filtering resistor R1 and the filtering capacitor C1 are electronically connected in series between the inverting input terminal 2 and the output terminal 3 of the voltage follower U1. The output terminal 3 of the voltage follower U1 is electronically connected to a gate g1 of the first MOSFET M1 via the current limiting resistor R3. The control terminal 4 is electronically connected to the enabling circuit 50. A source s1 of the first MOSFET M1 is electronically connected to the inverting input terminal 2 of the voltage follower U1, and is grounded via the loading resistor R0. A drain d1 of the first MOSFET M1 is electronically connected to the output terminal of the VRM 200. In the exemplary embodiment, the source s1 of the first MOSFET M1 is electronically connected to the inverting input terminal 2 of the voltage follower U1 via the current limiting resistor R4. The current limiting resistor R4 is configured to prevent a current output from the inverting input terminal 2 flowing to the node between the between the source s1 of the first MOSFET M1 and the loading resistor R0, thereby preventing a detection of the output current Io from being influenced by the current output from the output terminal 2 of the voltage follower U1.

A voltage on the output terminal 3 of the voltage follower U1 has the same voltage phase as the voltage phase of a voltage on the non-inverting input terminal 1 of the voltage follower U1, and a voltage gain of the voltage follower U1 is approximately about equal to one. Therefore, an output signal of the voltage follower U1 is the square-wave signal. The square-wave signal output from the output terminal 3 of the voltage follower U1 switches the first MOSFET M1 on and off alternately, such that the output current Io output from the VRM 200 and flowing through the loading resistor R0 is a dynamic current, which is changed actively because of the switch of the first MOSFET M1.

According to characteristics of the operational amplifier, the current output from the inverting input terminal 2 of the voltage follower U1 is approximately equal to zero. Therefore, a voltage drop across the current limiting resistor R4 is very small, a voltage potential on the source s1 of the first MOSFET M1 is approximately equal to a voltage potential on the inverting input terminal 2 of the voltage follower U1. According to a virtual short characteristic of the operational amplifier, a voltage potential of the non-inverting input terminal 1 of the voltage follower U1 is about equal to the voltage potential of the inverting input terminal 2. Therefore, the voltage potential on the source s1 of the first MOSFET M1 is about equal to an amplitude of the square-wave signal. The output current Io is a quotient of the voltage potential of the source s1 of the first MOSFET M1 and the resistance of the loading resistor R0. Thus, the amplitude of the output current Io is regulated by regulating the amplitude of the square-wave signal, and the slope of the output current Io is regulated accordingly. In other words, when the rise times are about equal, the greater the value of the output current Io, the greater the slope. Additionally, since the amplitude output current Io is changed with the change of the amplitude of the square-wave signal, the output current Io has the same rise time, drop time, frequency, and duty cycle as the rise time, drop time, frequency, and duty cycle of the square-wave signal. Therefore, the rise time and the drop time of the output current Io can be regulated by regulating the rise time and the drop time of the square-wave signal. The amplitude of the output current Io being about equal, the greater the rise time, the less the slope.

In the exemplary embodiment, the loading circuit 30 further includes a npn-type bipolar junction transistor (BJT) Q1, and a pnp-type BJT Q2. The npn-type BJT Q1 and the pnp-type BJT Q2 cooperate to enhance a drive capability of the square-wave signal. In detail, the output terminal 3 of the voltage follower U1 is electronically connected to a base b1 of the npn-type BJT Q1 and the base b2 of the pnp-type BJT Q2 via the current limiting resistor R5. A collector c1 of the npn-type BJT Q1 is electronically connected to a +5V power supply; an emitter e1 of the npn-type BJT Q1 is electronically connected to an emitter e2 of the pnp-type BJT Q2; and a node between the emitter e1 and e2 is electronically connected to the gate g1 of the first MOSFET M1. A collector c2 of the pnp-type BJT Q2 is electronically connected to a −5V power supply.

The current detection circuit 40 includes a operational amplifier U2, three current limiting resistors R6-R8, and a feedback resistor R9. The operational amplifier U2 includes a non-inverting input terminal 5, an inverting input terminal 6, an output terminal 7, and a control terminal 8. The non-inverting input terminal 5 is electronically connected to a node between the loading resistor R0 and the source s1 via the current limiting resistor R6, and a node between the non-inverting input terminal 5 and the current limiting resistor R6 is grounded via the current limiting resistor R8. The inverting input terminal is electronically connected to a node between the load resistor R0 and ground via the current limiting resistor R7, and a node between the inverting input terminal 7 and the current limiting resistor R7 is electronically connected to the output terminal 7 via the feedback resistor R9. The output terminal 7 is electronically connected to the current detection P1 of the controller 10. The operational amplifier U2 amplifies the output current Io flowing through the loading resistor R0, converts the output current Io into a voltage signal, and outputs the voltage signal to the controller 10. The controller 10 calculates the value of the output current Io according to the voltage signal, and calculates the slope of the output current Io according to the change of the value of the output current Io.

The enabling circuit 50 is electronically connected to the controller 10. The controller 10 controls the operations of the loading circuit 30 and the current detection circuit 40 by controlling the enabling circuit 50. The enabling circuit 50 includes a second MOSFET M2, and a pull-up resistor R10. A gate g2 of the second MOSFET M2 is electronically connected to the control pin P2 of the controller; a source s2 of the second MOSFET M2 is grounded; and a drain d2 is electronically connected the +5V power supply via the pull-up resistor R10, and is electronically connected to the control terminal 4 of the voltage follower U1 and the control terminal 8 of the operational amplifier U2. The controller 10 controls switch the second MOSFET M2 on or off, to change the voltage level of the control terminals 4 and 8, thereby activating or deactivating the voltage follower U1 and the operational amplifier U2. In the exemplary embodiment, the control terminals 4 and 8 are activated by a high level voltage signal (e.g. logic 1). When the controller 10 outputs a low level voltage signal (e.g. logic 0) to the second MOSFET M2 to switch off the second MOSFET M2, the voltages of the control terminals 4 and 8 are high, the voltage follower U1 and the operational amplifier U2 start to work. Alternatively, when the controller 10 outputs a high level voltage signal (e.g. logic 1) to the second MOSFET M2 to switch on the second MOSFET M2, the voltages of the control terminals 4 and 8 are low, and the voltage follower U1 and the operational amplifier U2 stop working. In other embodiment, the enabling circuit 50 is electronically connected to only one of the voltage follower U1 and the operational amplifier U2, and the controller 10 controls operation of only one of the voltage follower U1 and the operational amplifier U2.

In the exemplary embodiment, the preset value of slope is input by a keyboard circuit 60 electronically connected to the controller 10. The power supply test device 100 can set different slops of the output current Io by inputting different preset values. In addition, parameters of the square-wave signal, such as amplitude, rise time, drop time, frequency, and duty cycle, are input by the keyboard circuit 60, the controller 10 controls the function generator 20 to output corresponding square-wave signals according to these parameters.

The display 70 is electronically connected to the controller 10, to display the preset value and the parameters input by the keyboard circuit 60.

In use, The drain d1 of the first MOSFET M1 is electronically connected to the VRM 200, and a preset value of slop and the aforementioned parameters of the square-wave signal are input by the keyboard circuit 60. The working process of the power supply test device 100 can be carried out by, but is not limited to, the following steps. The controller 10 controls the function generator 20 generating a square-wave signal according the parameters, and controls the enabling circuit 50 to enable the loading circuit 30 and the current detection circuit 40. The enabled loading circuit 30 drives the VRM 200 to output the output current Io according to the square-wave signal; the current detection circuit 40 cooperates with the controller 10 in detecting the change of the output current Io to detect a slope of the output current Io. The controller 10 compares the detected slope with the preset value, and controls the function generator 20 to regulate the amplitude and/or the rise time of the square-wave signal according to the comparison, until the value of the slope of the output current Io is about equal to the preset value. At this time, the power supply test device 100 serves as a dynamic electronic load which drives the VRM 200 to output a dynamic output current Io with a preset slope, thereby executing a dynamic response test for the VRM 200.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A power supply test device, comprising:
   a function generator outputting a square-wave signal;
   a loading circuit electronically connected to the function generator and a power supply, the loading circuit regulating an output current of the power supply according to the square-wave signal;
   a current detection circuit; and
   a controller electronically connected to the current detection circuit and the function generator, the controller cooperating with the current detection circuit in detecting a slope of the output current, comparing the detected slope with a preset value, and regulating the square-wave signal according to the comparison to regulate the slope of the output current.

2. The power supply test device of claim 1, wherein the controller regulates one of a amplitude and a rise time of the square-wave signal to regulate the slope of the output current.

3. The power supply test device of claim 1, wherein the loading circuit comprises a voltage follower, a first metal-oxide-semiconductor field-effect transistor (MOSFET), and a loading resistor, a non-inverting input terminal of the voltage follower is electronically connected to the output of the function generation to receive the square-wave signal; an output terminal of the voltage follower is electronically connected to a gate of the first MOSFET; a drain of the first MOSFET is electronically connected to the output of the power supply, a source of the first MOSFET is grounded via the loading resistor, and a node between the source of the MOSFET and the loading resistor is electronically connected to an inverting input terminal of the voltage follower.

4. The power supply test device of claim 3, wherein the loading circuit further comprises a filtering resistor and a filtering capacitor, the filtering resistor and the filtering capacitor are connected in series between the output terminal and the inverting terminal of the voltage follower.

5. The power supply test device of claim 3, wherein the loading circuit further comprises a current limiting resistor that is electronically connected between the inverting input terminal of the voltage follower and a node between the source of the first MOSFET and the loading resistor, the first current limiting resistor prevents a current output from the inverting input terminal of the voltage follower flowing to the node between the source of the first MOSFET and the loading resistor.

6. The power supply test device of claim 3, wherein the loading circuit further comprises a npn-type bipolar junction transistor (BJT), a pnp-type BJT, a first power and a second power; the output terminal of the voltage follower is electronically connected to bases of the npn-type BJT and the pnp-type BJT; a collector of the npn-type BJT is electronically connected to the first power; an emitter of the npn-type BJT is electronically connected to an emitter of the pnp-type BJT, and a node between the emitters of the npn-type BJT and the pnp-type BJT is electronically connected to gate of the first MOSFET; a collector of the pnp-type BJT is electronically connected to the second power.

7. The power supply test device of claim 3, wherein the current detection circuit comprises a operational amplifier, a non-inverting input terminal of the operational amplifier is electronically the node between the source of the first MOSFET and the loading resistor, an inverting input terminal of the operational amplifier is electronically connected to a node between the loading resistor and ground, and an output terminal of the operational amplifier is electronically connected to the controller.

8. The power supply test device of claim 7, wherein the operational amplifier amplifies the output current flowing through the loading resistor, converts the output current into a voltage signal, and outputs the voltage signal to the controller; the controller calculates the value of the output current according to the voltage signal, and calculates the slope of the output current according to the change of the value of the output current.

9. The power supply test device of claim 3, further comprising an enabling circuit, wherein the voltage follower comprises a control terminal, the enabling circuit comprises a second MOSFET and a pull-up resistor; a gate of the second MOSFET is electronically connected to the controller, a source of the second MOSFET is grounded, and a drain of the second MOSFET is electronically connected to a power via the pull-up resistor; a node between the drain of the second MOSFET and the pull-up resistor is electronically connected to the control terminal of the voltage follower.

10. The power supply test device of claim 9, wherein the controller switches the second MOSFET on to deactivate the voltage follower, and switches the second MOSFET off to activate the voltage follower.

11. The power supply test device of claim 7, further comprising an enabling circuit, wherein the operational amplifier comprises a control terminal, the enabling circuit comprises a second MOSFET and a pull-up resistor; a gate of the second MOSFET is electronically connected to the controller, a source of the second MOSFET is grounded, and a drain of the second MOSFET is electronically connected to a power via the pull-up resistor; a node between the drain of the second MOSFET and the pull-up resistor is electronically connected to the control terminal of the operational amplifier.

12. The power supply test device of claim 1, further comprising a keyboard circuit electronically connected to the controller, wherein the keyboard circuit input the preset value to the controller.

13. The power supply test device of claim 1, further comprising a display electronically connected to the controller, wherein the controller displays the preset value on the display.

* * * * *